(12) United States Patent
Iwanaga et al.

(10) Patent No.: US 9,167,732 B2
(45) Date of Patent: Oct. 20, 2015

(54) VEHICLE-MOUNTING CHARGING APPARATUS AND VEHICLE MOUNTED THEREWITH

(75) Inventors: Izumi Iwanaga, Kanagawa (JP); Taro Katayama, Kanagawa (JP); Sohtaro Okano, Kanagawa (JP); Kenichi Koike, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 56 days.

(21) Appl. No.: 13/990,827

(22) PCT Filed: Apr. 19, 2012

(86) PCT No.: PCT/JP2012/002728
§ 371 (c)(1),
(2), (4) Date: May 31, 2013

(87) PCT Pub. No.: WO2012/144222
PCT Pub. Date: Oct. 26, 2012

(65) Prior Publication Data
US 2013/0249482 A1    Sep. 26, 2013

(30) Foreign Application Priority Data

Apr. 22, 2011 (JP) ................................. 2011-095772

(51) Int. Cl.
*H02J 7/00* (2006.01)
*H05K 9/00* (2006.01)
(Continued)

(52) U.S. Cl.
CPC ............ *H05K 9/0007* (2013.01); *B60L 11/182* (2013.01); *H01M 10/46* (2013.01); *H02J 7/0042* (2013.01); *H02J 7/0044* (2013.01); *H02J 7/025* (2013.01); *B60L 2240/36* (2013.01); *H01M 2/1066* (2013.01); *H01M 10/44* (2013.01); *Y02T 10/7005* (2013.01); *Y02T 90/12* (2013.01); *Y02T 90/121* (2013.01); *Y02T 90/122* (2013.01); *Y02T 90/125* (2013.01); *Y02T 90/14* (2013.01)

(58) Field of Classification Search
CPC ....................................................... H02J 7/025
USPC ........................................................ 320/108
See application file for complete search history.

(56) References Cited

U.S. PATENT DOCUMENTS 8,624,547 B2 * 1/2014 Thorsell et al. ............... 320/108
2003/0117728 A1 6/2003 Hutzel et al.
(Continued)

FOREIGN PATENT DOCUMENTS

CN  101902062    12/2010
DE  298 17 614 U1  1/1999
(Continued)

OTHER PUBLICATIONS

International Search Report for Application No. PCT/JP2012/002728, dated Jul. 10, 2012.

*Primary Examiner* — Edward Tso
*Assistant Examiner* — Ahmed Omar
(74) *Attorney, Agent, or Firm* — Wenderoth, Lind & Ponack, L.L.P.

(57) ABSTRACT

A vehicle-mounting charging apparatus includes a body case adapted to be mounted to a ceiling part of a vehicle, and a charging coil for contactless charging that is provided in the body case. A shielding part for shielding electromagnetic waves is provided on a lower side of the charging coil.

8 Claims, 4 Drawing Sheets

(51) Int. Cl.
  *H01M 10/46* (2006.01)
  *H02J 7/02* (2006.01)
  *B60L 11/18* (2006.01)
  *H01M 2/10* (2006.01)
  *H01M 10/44* (2006.01)

(56) References Cited

U.S. PATENT DOCUMENTS

| | | |
|---|---|---|
| 2005/0047081 A1 | 3/2005 | LaPorte et al. |
| 2006/0002123 A1 | 1/2006 | Hutzel et al. |
| 2008/0080076 A1 | 4/2008 | Hutzel et al. |
| 2009/0005136 A1 | 1/2009 | Hutzel et al. |
| 2009/0267558 A1 | 10/2009 | Jung |
| 2009/0305746 A1 | 12/2009 | Pursche et al. |
| 2012/0120239 A1 | 5/2012 | Hutzel et al. |

FOREIGN PATENT DOCUMENTS

| | | |
|---|---|---|
| DE | 10 2005 058 636 A1 | 6/2007 |
| DE | 10 2006 039 808 A1 | 3/2008 |
| EP | 1 103 420 A2 | 5/2001 |
| EP | 1 494 106 A1 | 1/2005 |
| JP | 2007-104868 A | 4/2007 |
| JP | 2011-254634 A | 12/2011 |
| WO | 2007/118694 A1 | 10/2007 |
| WO | WO 2009/031639 A1 | 3/2009 |

\* cited by examiner

VEHICLE-MOUNTING CHARGING APPARATUS AND VEHICLE MOUNTED THEREWITH

THIS APPLICATION IS A U.S. NATIONAL PHASE APPLICATION OF PCT INTERNATIONAL APPLICATION PCT/JP2012/002728.

TECHNICAL FIELD

The present invention relates to a vehicle-mounting charging apparatus and a vehicle mounted therewith.

BACKGROUND ART

With the widespread use of mobile terminals, a vehicle-mounting charging apparatus has been suggested which allows the mobile terminals to be charged also in the vehicle (see Patent Document 1, for example).

Specifically, the vehicle-mounting charging apparatus includes a case whose one face has an opening, a lid which covers the opening of the case in an openable/closable manner and a charging coil which is disposed in an inner surface portion of the case opposite to the lid.

When the mobile terminal is charged using the vehicle-mounting charging apparatus, power is supplied by magnetic flux in such a way that the mobile terminal is accommodated in the case and the charging coil of the vehicle-mounting charging apparatus and a charging coil of the mobile terminal are placed to face each other.

RELATED ART DOCUMENTS

Patent Document

Patent Document 1: JP-A-2007-104868

SUMMARY OF THE INVENTION

Problems to be Solved by the Invention

In the related art above described, there is a possibility that the reliability of a vehicle control such as a keyless entry control is decreased.

Specifically, the vehicles in recent years perform a so-called keyless entry control in order to control the open/close of the door. In this keyless entry control, the opening/closing control of the door or the like is performed by the wireless communication between a remote control key and a transceiver of a vehicle.

In this case, when the mobile terminal is charged in the vehicle by the vehicle-mounting charging apparatus, electromagnetic waves emitted from a charging coil thereof affect the wireless communication between the remote control key and the transceiver of the vehicle. As a result, there is a possibility that the reliability of the keyless entry control can be decreased.

Accordingly, an object of the present invention is to prevent a decrease in the reliability of a vehicle control such as a keyless entry control.

Means for Solving the Problems

The invention provides a vehicle-mounting charging apparatus, comprising: a body case adapted to be mounted to a ceiling part of a vehicle; and a charging coil for contactless charging that is provided in the body case, wherein a shielding part for shielding electromagnetic waves is provided on a lower side of the charging coil to achieve the above purpose.

Advantageous Effects of the Invention

According to the present invention, it is possible to prevent a decrease in the reliability of a vehicle control such as a keyless entry control.

MODE FOR CARRYING OUT THE INVENTION

Hereinafter, an illustrative embodiment of the present invention will be described with reference to the drawings.
(First Embodiment)

Figure 1:
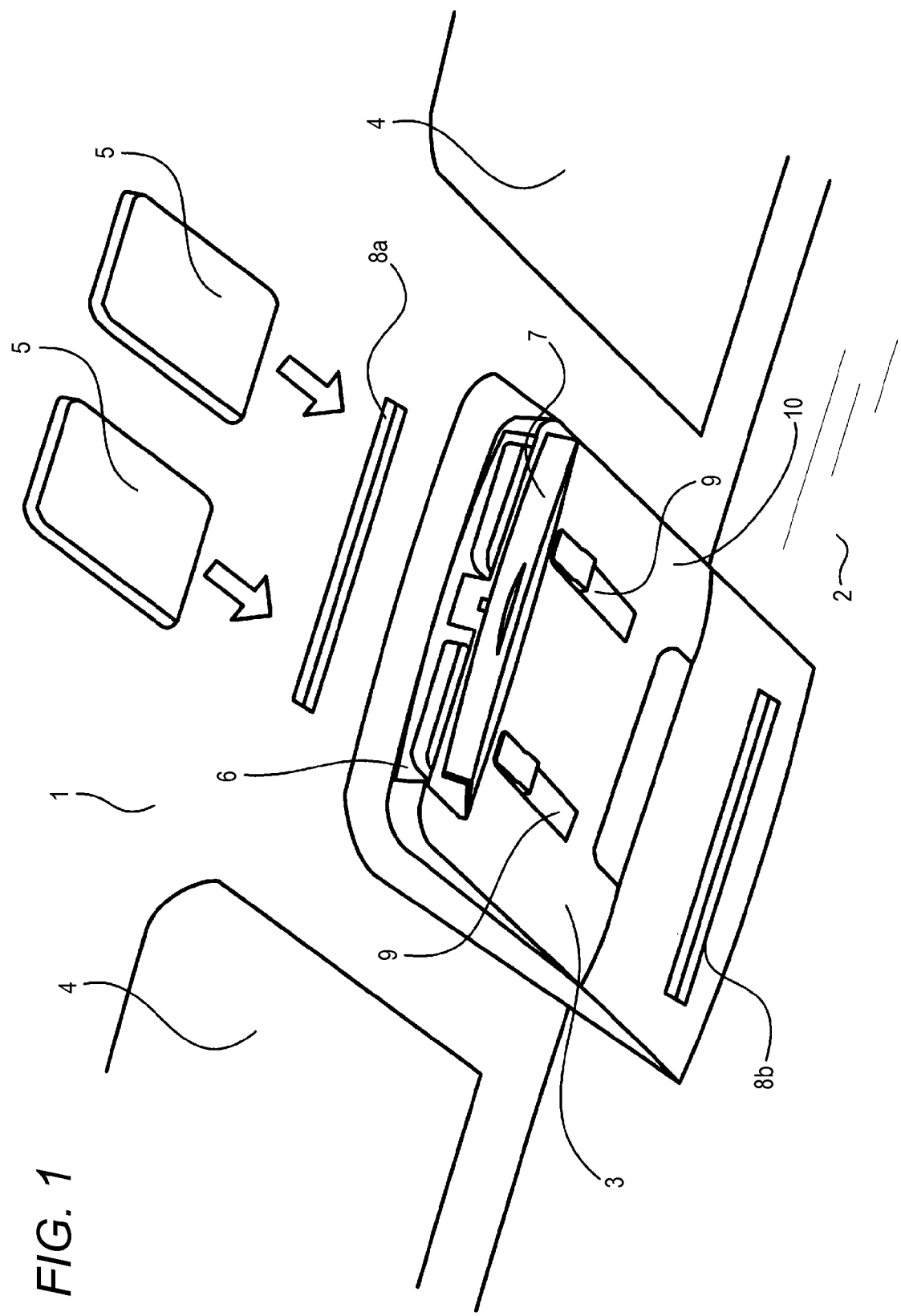
FIG. 1 is a view showing a vehicle-mounting charging apparatus according to a first embodiment of the present invention in the state of being mounted to a vehicle.

FIG. 1 shows a state where a body case 10 of a vehicle-mounting charging apparatus 3 is provided in an overhead console near a vehicle ceiling 1 and a windshield 2 in a vehicle interior. Sun visors 4 are installed to both left and right sides of the vehicle-mounting charging apparatus 3.

An accommodation part 6 for accommodating a mobile terminal 5 is provided in the body case 10 of the vehicle-mounting charging apparatus 3. A door 7 is mounted to the accommodation part 6, and the mobile terminal 5 can enter the accommodation part 6 through the door 7. Although FIG. 1 shows a case where a plurality of mobile terminals is accommodated, one mobile terminal 5 may be accommodated.

A slit-shaped opening 8a is provided in the rear side of a portion of the vehicle ceiling 1 on which the body case 10 is installed.

Further, a slit-shaped opening 8b is provided in a portion of the body case 10 on the side of the windshield 2.

Although the body case 10 is provided in the overhead console near the vehicle ceiling of a vehicle in the present embodiment, the body case may be provided in a rearview mirror part of the vehicle ceiling.

Figure 2:
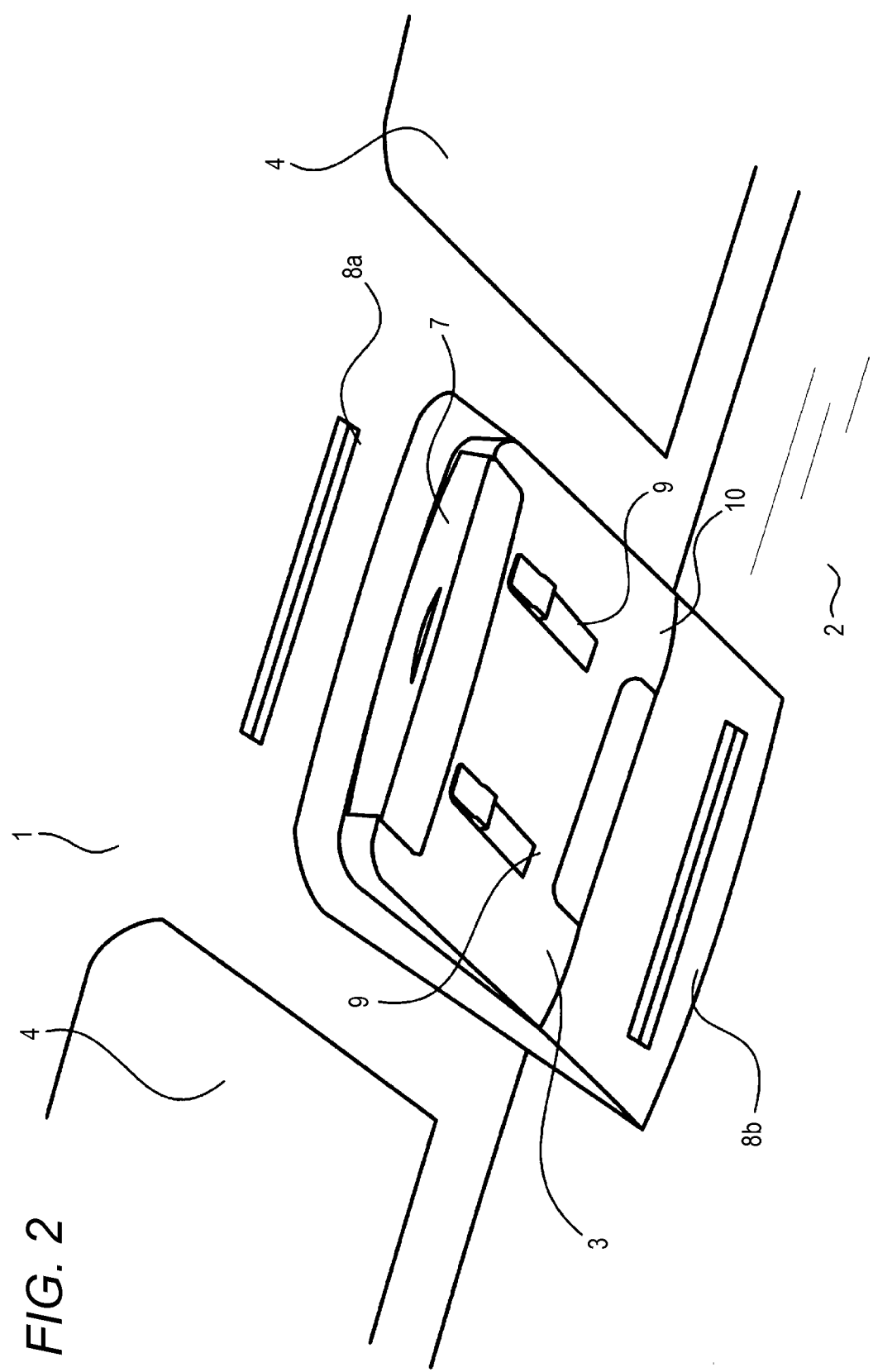
FIG. 2 is a view showing the vehicle-mounting charging apparatus according to a first embodiment of the present invention in the state of being mounted to a vehicle.

FIG. 1 show a state where the door 7 is opened when accommodating the mobile terminal 3 in the vehicle-mounting charging apparatus 3 and FIG. 2 show a state where the mobile terminal 5 is accommodated in the vehicle-mounting charging apparatus 3 and is charged.

Coil position adjustment buttons 9 are provided in the body case 10 of the vehicle-mounting charging apparatus 3. The coil position adjustment buttons 9 can adjust the position of a charging coil (a reference numeral 14 in FIG. 3) of the vehicle-mounting charging apparatus 3 in accordance with a position of a charging coil of the mobile terminal 5.

Figure 3:
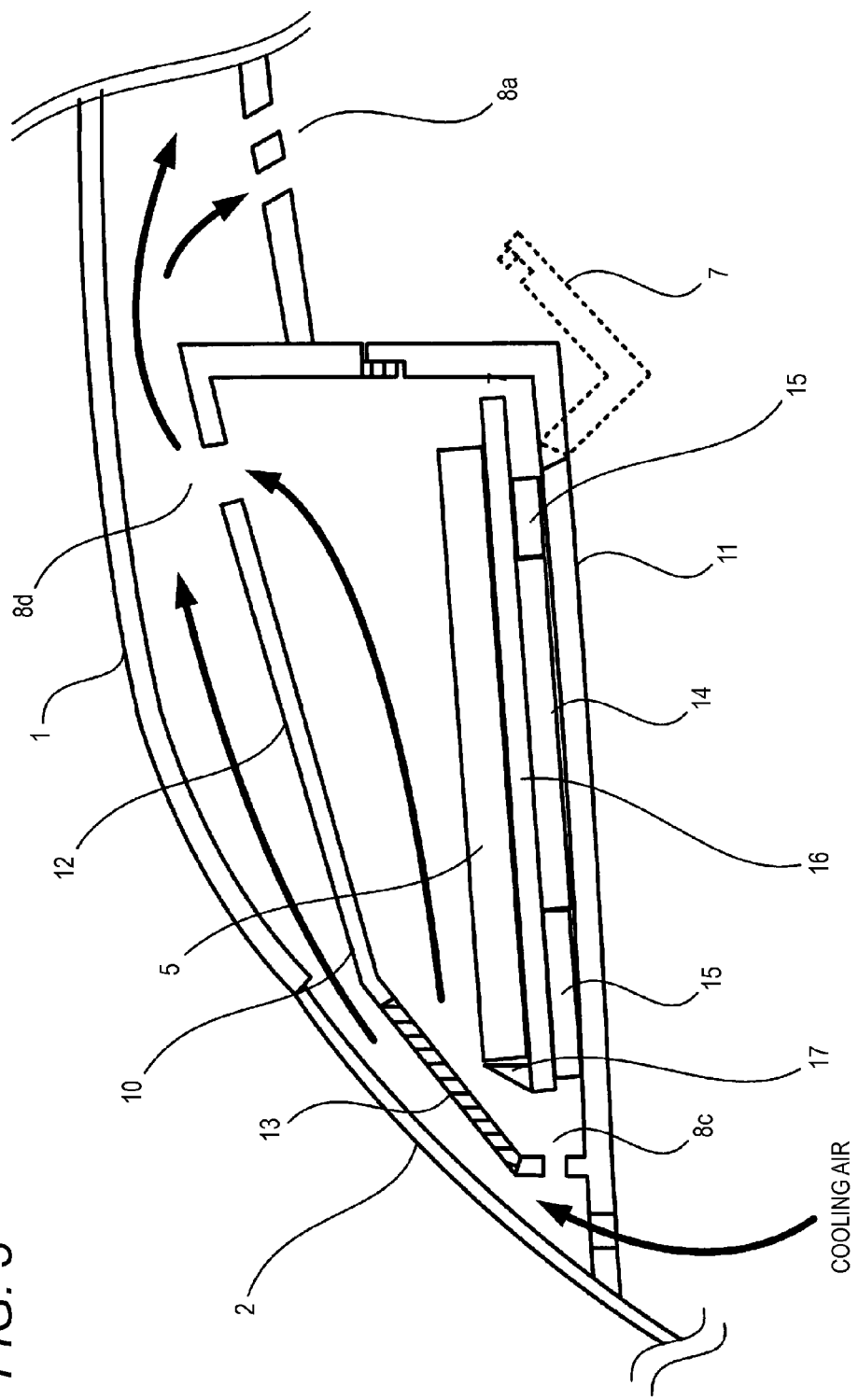
FIG. 3 is a sectional view of the vehicle-mounting charging apparatus.

FIG. 3 show a sectional view of the body case 10 of the vehicle-mounting charging apparatus 3 which is provided in the overhead console near the vehicle ceiling 1 and the windshield 2, as shown in FIG. 1. The sectional view of FIG. 3 is a view taken along the center of the mobile terminal 5 in a state of being accommodated in the accommodation part 6.

The left side of FIG. 3 represents a front side of a vehicle and the right thereof represents a rear side of the vehicle.

As shown in FIG. 3, a front portion of the accommodation part 6 of the vehicle-mounting charging apparatus 3 is arranged so as to face an upper portion of the windshield 2.

Further, a portion of the windshield 2 to which the vehicle-mounting charging apparatus 3 is mounted is composed of a material through which the electromagnetic wave can pass.

By such a configuration, the mobile terminal 5 having a GPS antenna installed at a leading end thereof is able to receive GPS radio wave satisfactorily even when the mobile terminal 5 having the GPS antenna installed at the leading end thereof is accommodated in the accommodation part 6.

A mounting position of the body case 10 of the vehicle-mounting charging apparatus 3 may be adjusted in accordance with a mounting position of the GPS antenna of the mobile terminal 5 or a portion through which the electromagnetic wave can pass may be provided in the vehicle ceiling 1.

Next, a structure of the vehicle-mounting charging apparatus 3 will be described with reference to FIG. 3.

The door 7 is provided in the accommodation part 6 to allow entrance of the mobile terminal 5. The door 7 has an openable/closable structure and the state thereof indicated by a dotted line of FIG. 3 corresponds to FIG. 1. Further, a metal plate is adhered to the door 7 to shield the electromagnetic wave.

Further, a shielding part 11 for shielding the electromagnetic wave is provided in a vehicle interior side (a lower side of the body case 10) of the body case 10 to configure the vehicle-mounting charging apparatus 3. In addition, a top surface 12 is provided in an upper side (a side of the vehicle ceiling 1) of the body case 10. Preferably, the top surface 12 is configured to shield heat.

Furthermore, a light shielding part 13 is provided at a portion (a portion facing a portion through which the electromagnetic wave passes) of the top surface 12 of the body case 10 to configure the vehicle-mounting charging apparatus 3, which is opposed to the windshield 2. The light shielding part 13 causes the interior of the body case not to be visible from the outside through the windshield. However, the electromagnetic wave can pass through the light shielding part 13.

A circuit board 15 equipped with the charging coil 14 for contactless charging is provided on the shielding part 11 in the body case 10. An installation base 16 on which the mobile terminal 5 is installed is provided on the circuit board.

The installation base 16 is provided with a slope which is lowered toward the front side (the side of the windshield 2) of the vehicle. A stopper 17 to restrict an installation position of the mobile terminal 5 is provided at a lower side of the slope. The stopper 17 is provided at a portion facing the light shielding part 13. By this stopper 17, the mobile terminal 5 having the GPS antenna installed at the leading end thereof can be installed at a location to receive the GPS radio wave satisfactorily.

Thus, focusing on the fact that a using range of the remote control key to be used in the keyless entry control is in a location lower than a predetermined height, the present embodiment has a configuration that the charging coil 14 to be used in the contactless charging is provided in the vicinity of the vehicle ceiling 1 and the shielding part 11 to shield the electromagnetic waves is provided below the charging coil 14. The shielding part 11 shields the electromagnetic waves emitted from the charging coil 14 so as to prevent a predetermined amount or more of electromagnetic wave from passing through a lower surface of the body case 10. The shielding part 11 may be formed from any material such as a metallic plate member, as long as the material has a property to shield the electromagnetic wave for contactless charging emitted between the vehicle-mounting charging apparatus 3 and the mobile terminal 5.

Accordingly, it is possible to reduce the influence of the using range of the remote control key on the wireless communication between the remote control key and the transceiver of the vehicle. As a result, it is possible to prevent a decrease in the reliability of the keyless entry control.

Meanwhile, it is possible to adjust a shielding range of the electromagnetic wave emitted from the charging coil 14 by the shapes of the shielding part 11 and the door 7.

Next, a cooling structure of the body case 10 is described.

The installation base 16 on which the mobile terminal 5 is installed is provided with the slope which is lowered toward the front side (the side of the windshield 2) of the vehicle, as described above. An opening (first opening) 8c is provided on a wall surface of the body case 10 located at a lower side of the slope of the installation base 16 and an opening (second opening) 8d is provided on a top surface of the body case 10 located at an upper side of the slope of the installation base 16.

The first opening 8c is provided at a position lower than the stopper 17 to restrict the installation position of the mobile terminal 5 installed on the installation base 16.

In this way, even when the sunlight that has passed through the windshield 2 enters the first opening 8c, the mobile terminal 5 is not directly exposed to the sunlight.

Furthermore, as shown in FIG. 3, as cooling air in the vehicle interior enters through the opening 8b provided at a front side of a lower surface of the body case 10 and passes through an upper portion of the mobile terminal 5, the cooling air becomes warm and therefore is discharged through the opening 8d provided on the top surface 12.

Accordingly, in addition to shielding the electromagnetic waves emitted from the charging coil 14, it is possible to achieve a configuration that can be efficiently cooled.

Next, a system configuration diagram of a vehicle mounted with the vehicle-mounting charging apparatus 3 is described.

Figure 4:
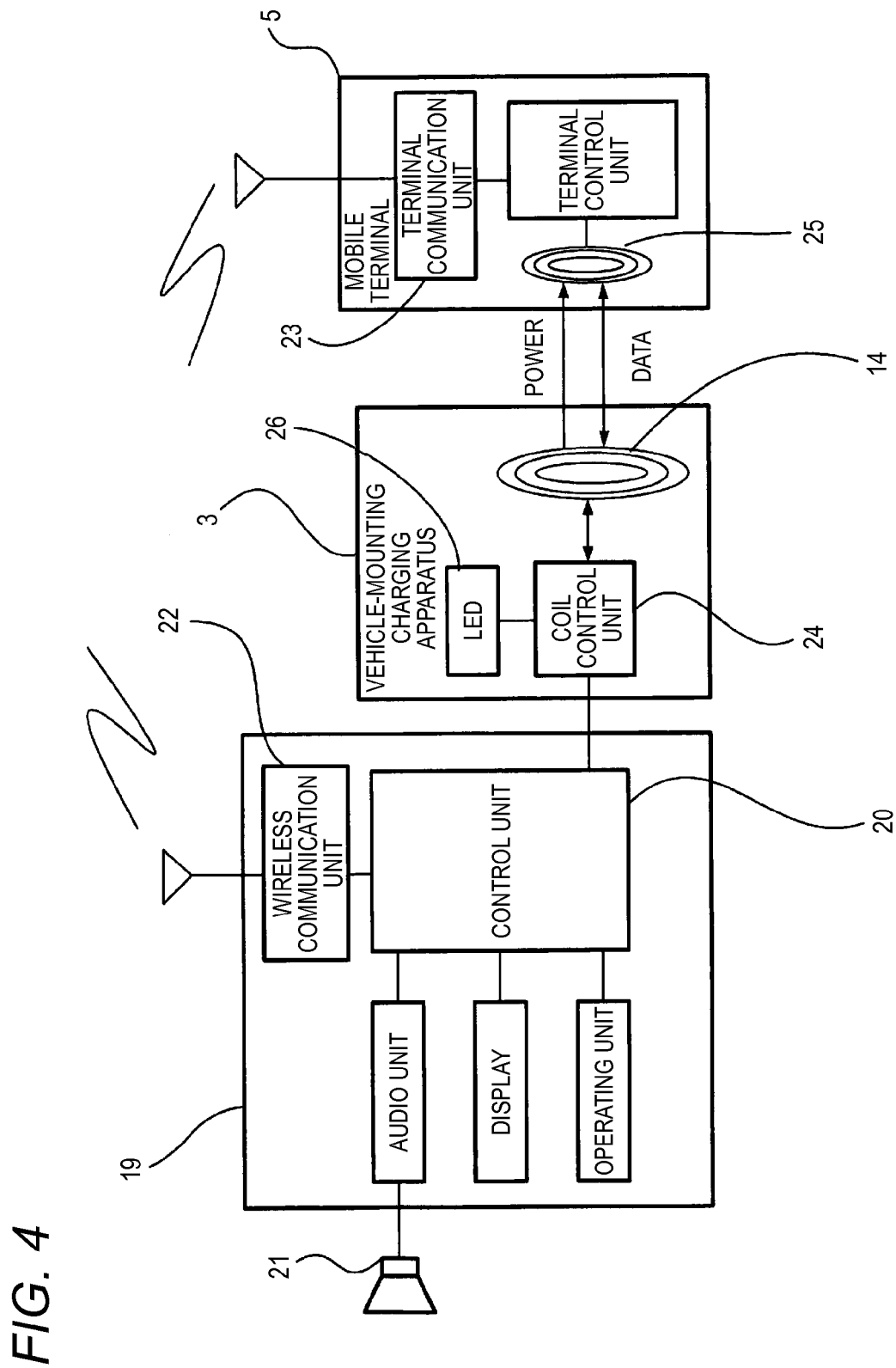
FIG. 4 is a system configuration diagram of a vehicle mounted therewith.

As shown in FIG. 4, the vehicle-mounting charging apparatus 3 is connected to an in-vehicle equipment 19 installed to the vehicle.

For example, the in-vehicle equipment 19 is an audio device and a control unit 20 thereof generates a sound from a speaker 21. Further, the control unit 20 is connected to a wireless communication unit 22 to use Bluetooth (registered trademark) and also communicates with a terminal communication unit 23 of the mobile terminal 5.

Further, the vehicle-mounting charging apparatus 3 connected to the in-vehicle equipment 19 includes the charging coil 14 and a coil control unit 24 therefor. The vehicle-mounting charging apparatus can perform the contactless charging by approaching the charging coil 14 and a charging coil 25 of the mobile terminal 5 so as to face each other.

That is, the contactless charging of the mobile terminal 5 is performed by directing the magnetic flux from the charging coil 14 of the vehicle-mounting charging apparatus 3 toward the charging coil 25 of the mobile terminal 5.

Further, the coil control unit 24 is connected to an LED 26 exposed to an outer surface of the body case 10 and informs a charging state of the contactless charging in such a way that a lighting state of the LED 26 is changed in accordance with the state of the charging coil 14.

As described above, the vehicle-mounting charging apparatus 3 of the present embodiment includes the body case 10 which can be mounted to the ceiling part of the vehicle and the charging coil 14 for contactless charging which is provided in the body case 10 and has a configuration that the shielding part 11 for shielding the electromagnetic waves is provided on a lower side of the charging coil 14. By this configuration, it is possible to prevent a decrease in the reliability of a vehicle control such as a keyless entry control.

The present embodiment has focused on the fact that a using range of the remote control key to be used in the keyless entry control etc., is in a location lower than a predetermined height. Actually, a range to receive the radio wave of the remote control key is also often in a location lower than the predetermined height. Accordingly, as an example, the present embodiment has a configuration that the charging coil 14 to be used in the contactless charging is provided in the vicinity of the ceiling of the vehicle and the shielding part 11 to shield the electromagnetic waves is provided below the charging coil 14. By these configurations, it is possible to reduce the influence of the using range of the remote control key on the wireless communication between the remote control key and the transceiver of the vehicle. As a result, it is possible to prevent a decrease in the reliability of a vehicle control such as a keyless entry control.

Although the present invention has been described in detail with reference to particular illustrative embodiments, the present invention is not limited to the illustrative embodiments and it is obvious to those skilled in the art that the illustrative embodiments can be variously modified and combined without departing a spirit and a scope of the present invention.

This application is based upon Japanese Patent Application (Patent Application No. 2011-095772) filed on Apr. 22, 2011 and the contents of which are incorporated herein by reference.

Industrial Applicability

As described above, the present invention has an effect to prevent a decrease in the reliability of a vehicle control such as a keyless entry control.

Accordingly, the present invention is expected to be utilized as the vehicle-mounting charging apparatus.

DESCRIPTION OF REFERENCE NUMERALS AND SIGNS 1 vehicle ceiling
2 windshield
3 vehicle-mounting charging apparatus
4 sun visor
5 mobile terminal
6 accommodation part
7 door
8a opening
8b opening
8c opening
8d opening
9 coil position adjustment button
10 body case
11 shielding part
12 top surface
13 light shielding part
14 charging coil
15 circuit board
16 installation base
17 stopper
19 in-vehicle equipment
20 control unit
21 speaker
22 wireless communication unit
23 terminal communication unit
24 coil control unit
25 charging coil
26 LED

The invention claimed is:

1. A vehicle-mounting charging apparatus, comprising:
a body case adapted to be mounted to a ceiling part of a vehicle; and
a charging coil for contactless charging that is provided in the body case,
wherein a shielding part for shielding electromagnetic waves is provided on a lower side of the charging coil,
wherein the body case is adapted to be mounted to an overhead console part or a rearview mirror part of the vehicle,
wherein a light shielding part is provided at a portion of the body case facing a portion which is located near the ceiling portion of the vehicle and through which the electromagnetic wave passes.

2. The vehicle-mounting charging apparatus according to claim 1, wherein the shielding part shields the electromagnetic waves emitted from the charging coil so as to prevent a predetermined amount or more of electromagnetic wave from passing through a lower surface of the body case.

3. The vehicle-mounting charging apparatus according to claim 1, wherein the light shielding part faces a windshield of the vehicle.

4. The vehicle-mounting charging apparatus according to claim 1, wherein an installation base on which a mobile terminal to be charged by the charging coil is installed is provided in the body case;
wherein a stopper which restricts an installation position of the mobile terminal is provided on the installation base;
wherein the stopper is provided on a portion of the installation base facing the light shielding part.

5. The vehicle-mounting charging apparatus according to claim 4, wherein the installation base is provided with a slope;
wherein a first opening is provided on a wall surface of the body case located at a lower side of the slope of the installation base and a second opening is provided on a top surface of the body case located at an upper side of the slope of the installation base; and
wherein the first opening is provided at a position lower than the stopper which restricts the installation position of the mobile terminal installed on the installation base.

6. The vehicle-mounting charging apparatus according to claim 5, wherein the body case is provided with a door to allow entrance of the mobile terminal, and the door shields the electromagnetic wave.

7. A vehicle comprising the vehicle-mounting charging apparatus according to claim 1, wherein the vehicle-mounting charging apparatus is provided on the ceiling part of a vehicle interior.

8. The vehicle according to claim 7, wherein the vehicle-mounting charging apparatus is mounted to an overhead console part or a rearview mirror part of the vehicle interior.

* * * * *